(12) United States Patent
Al Zahrani et al.

(10) Patent No.: US 12,072,382 B2
(45) Date of Patent: Aug. 27, 2024

(54) SMART VOLTAGE DIP SIMULATOR APPARATUS AND METHOD

(71) Applicant: Saudi Arabian Oil Company, Dhahran (SA)

(72) Inventors: Gharmallah A. Al Zahrani, Dammam (SA); Nabil H. Kubaish, Saihat (SA); Nico Martin San Antonio, Abqaiq (SA)

(73) Assignee: Saudi Arabian Oil Company, Dhahran (SA)

( * ) Notice: Subject to any disclaimer, the term of this patent is extended or adjusted under 35 U.S.C. 154(b) by 243 days.

(21) Appl. No.: 17/652,737

(22) Filed: Feb. 28, 2022

(65) Prior Publication Data

US 2023/0273259 A1     Aug. 31, 2023

(51) Int. Cl.
  *H02P 1/16*     (2006.01)
  *G01M 15/02*    (2006.01)
  *G01R 31/34*    (2020.01)

(52) U.S. Cl.
  CPC .......... *G01R 31/343* (2013.01); *G01M 15/02* (2013.01); *F02N 2200/04* (2013.01); *F02N 2200/046* (2013.01)

(58) Field of Classification Search
  CPC .............. G05B 19/0423; G01R 31/343; F02N 2200/04; F02N 2200/046; G01M 15/02
  See application file for complete search history.

(56) References Cited

FOREIGN PATENT DOCUMENTS

| CN | 113009344 A | * | 6/2021 | |
| WO | WO-2020190500 A1 | * | 9/2020 | ........... G01R 31/343 |

* cited by examiner

*Primary Examiner* — Karen Masih
(74) *Attorney, Agent, or Firm* — Leason Ellis LLP

(57) ABSTRACT

A smart voltage dip simulator apparatus and method are configured to test a motor starter ride through circuit. The simulator apparatus includes a power supply, an output switch, a test switch, a test lamp, a time selector, and a programmable logic controller. The power supply provides an output voltage to the motor starter when an output switch is actuated. A test of the motor starter is executed and a duration of the test is controlled by a selected time setting. The controller includes code therein configured to apply a predetermined dip to reduce the applied input voltage to the power supply and to generate the output voltage applied to the motor starter for the selected duration of the test. A method is performed to operate the simulator.

20 Claims, 4 Drawing Sheets

SMART VOLTAGE DIP SIMULATOR APPARATUS AND METHOD

FIELD OF THE DISCLOSURE

The present disclosure relates generally to testing a motor, and, more particularly, to a smart voltage dip simulator apparatus and method configured to test a motor starter ride through circuit.

BACKGROUND OF THE DISCLOSURE

Large motors are employed in utility plants, such as a waste water plant, or in an industrial manufacturing/processing plant, such as petrochemical refinery. In order to ensure efficient operation of such plants, the motors must reliably start and function, even during dips and spikes in applied operating voltages. Motors can utilize alternating current (AC) auxiliary devices such as a ride through circuit in a motor starter, by which the motor continues to operate during voltage dips.

SUMMARY OF THE DISCLOSURE

According to an embodiment consistent with the present disclosure, a smart voltage dip simulator apparatus and method are configured to test a motor starter ride through circuit.

In an embodiment, a test apparatus is configured to test a motor starter, and comprises a power supply, an output switch, a test switch, a test lamp, a time selector, and a programmable logic controller (PLC). The power supply is configured to receive an applied input voltage and to provide an output voltage. The output switch is configured to operatively connect the power supply to the motor starter and to apply the output voltage to the motor starter when the output switch is actuated. The test switch has an OFF setting and an ON setting. A test of the motor starter is executed when the test switch is in the ON setting. The test lamp is configured to illuminate while the test is executed. The time selector includes a plurality of time settings. A duration of the test is controlled by a selected time setting from among the plurality of time settings. The PLC includes code therein configured to apply a predetermined dip to reduce the applied input voltage to the power supply and has code therein configured to generate the output voltage applied to the motor starter for the selected duration of the test.

The test apparatus can also include voltage dip selector having a plurality of dip settings, such that the predetermined dip is controlled by a selected dip setting from among the plurality of dip settings. In addition, the test apparatus can also include an output voltage jack configured to electrically couple the power supply to the motor starter through the output switch. Furthermore, the test apparatus can include a display configured to continuously display the applied input voltage and the provided output voltage. In addition, the test apparatus can include a power jack configured to connect the power supply to the output switch, with the power supply being an external power supply. Alternatively, the power supply can be a battery. In addition, the test apparatus can include a portable housing configured to retain therein the power supply, the output switch, the test switch, the test lamp, the time selector, and the PLC.

In another embodiment, a portable test apparatus is configured to test a motor starter. The portable test apparatus includes a power supply, an output switch, a test switch, a test lamp, a time selector, a PLC, and a portable housing. The power supply is configured to receive an input voltage and to provide an output voltage. The output switch is configured to operatively connect the power supply to the motor starter and to apply the output voltage to the motor starter when the output switch is actuated. The test switch has an OFF setting and an ON setting. A test of the motor starter is executed when the test switch is in the ON setting. The test lamp is configured to illuminate while the test is executed. The time selector includes a plurality of time settings, such that a duration of the test is controlled by a selected time setting from among the plurality of time settings. The PLC has code therein configured to apply a predetermined dip to reduce the applied input voltage to the power supply and has code therein configured to generate the output voltage applied to the motor starter for the selected duration of the test. The portable housing is configured to retain therein the power supply, the output switch, the test switch, the test lamp, the time selector, and the PLC.

The portable test apparatus also includes a voltage dip selector including a plurality of dip settings. The predetermined dip is controlled by a selected dip setting from among the plurality of dip settings. In addition, the portable test apparatus includes an output voltage jack configured to electrically couple the power supply to the motor starter through the output switch. Furthermore, the portable test apparatus includes a display configured to continuously display the applied input voltage and the provided output voltage. Still further, the portable test apparatus includes a power jack configured to connect the power supply to the output switch, with the power supply being an external power supply. Alternatively, the power supply is a battery. The portable test apparatus can also include a handle coupled to the housing.

In a further embodiment, a method is configured to test a motor starter, and includes receiving an input voltage from a power supply; providing an output voltage from the power supply; operatively connecting an output switch to the motor starter; actuating the output switch to electrically couple the power supply to the motor starter; selecting a time setting from among the plurality of time settings using a time selector; setting a duration of the test; applying a predetermined dip to reduce the applied input voltage to the power supply using a programmable logic controller (PLC) including code therein configured to generate the output voltage; setting a test switch to an ON setting; applying the output voltage to the motor starter for the selected duration of the test to execute a test of the motor starter; and illuminating a test lamp while the test is executed.

The method can also include controlling the predetermined dip using a dip setting selected from among the plurality of dip settings using a voltage dip selector. The method can further include electrically coupling the power supply to the motor starter through the output switch using an output voltage jack. In addition, the method can include continuously displaying the applied input voltage and the provided output voltage using a display. The method can also include connecting the power supply to the output switch using a power jack, and the power supply is an external power supply. Alternatively, the power supply can be a battery.

Any combinations of the various embodiments and implementations disclosed herein can be used in a further embodiment, consistent with the disclosure. These and other aspects and features can be appreciated from the following description of certain embodiments presented herein in accordance with the disclosure and the accompanying drawings and claims.

It is noted that the drawings are illustrative and are not necessarily to scale.

DETAILED DESCRIPTION OF CERTAIN EMBODIMENTS OF THE DISCLOSURE

Example embodiments consistent with the teachings included in the present disclosure are directed to a smart voltage dip simulator apparatus 10 and method 100 configured to test a motor starter ride through circuit.

Figure 1:
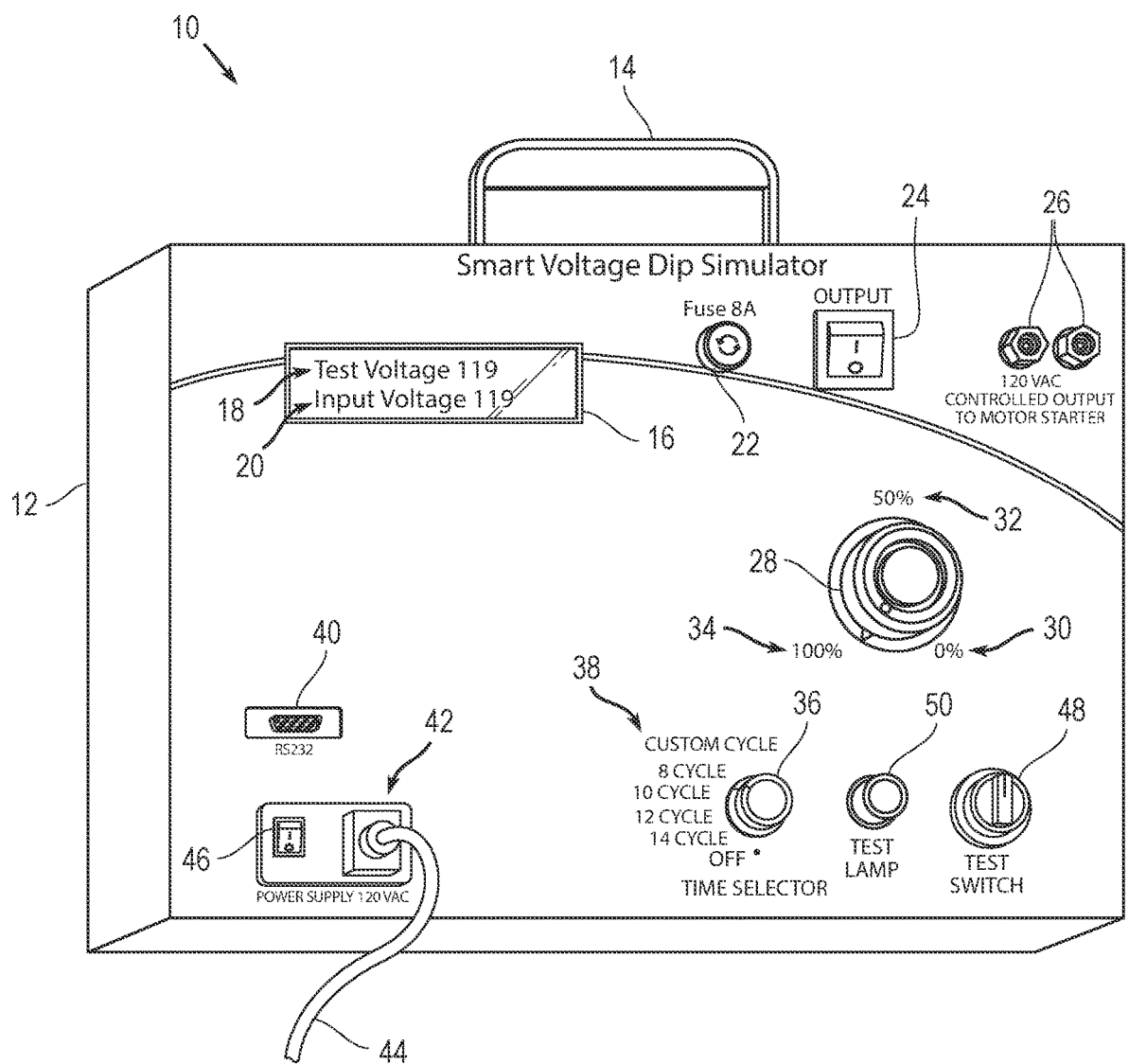
FIG. 1 is a diagram of a smart voltage dip simulator apparatus, according to an embodiment.
Figure 2:
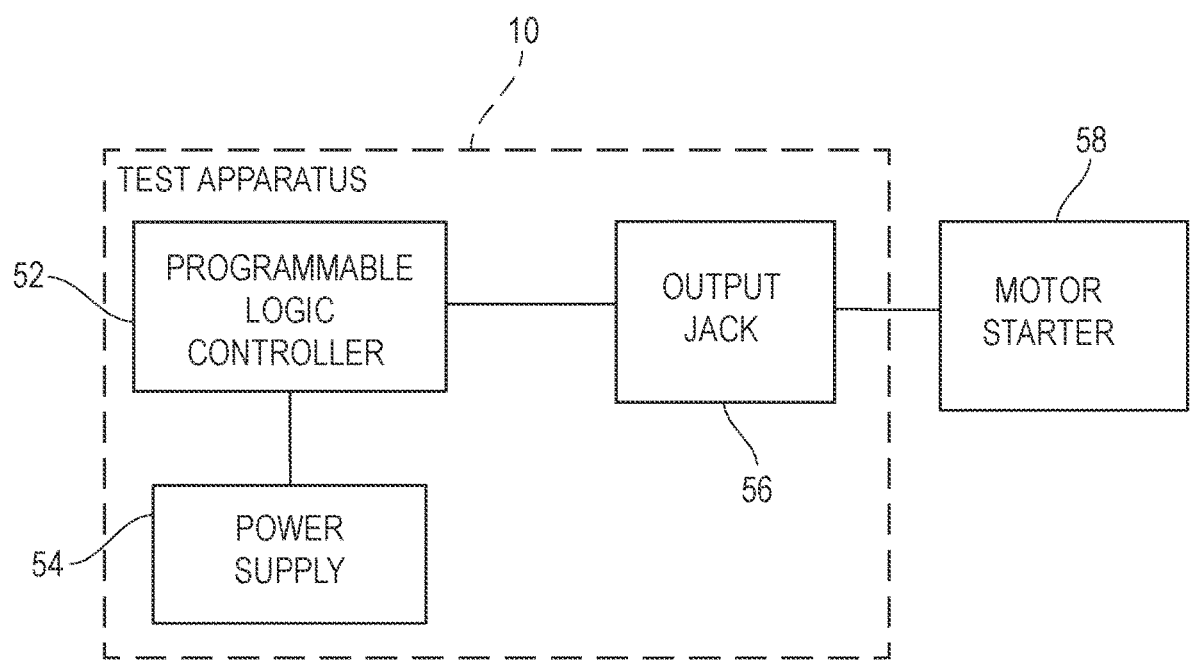
FIG. 2 is a schematic of the apparatus of FIG. 1.
Figure 3:
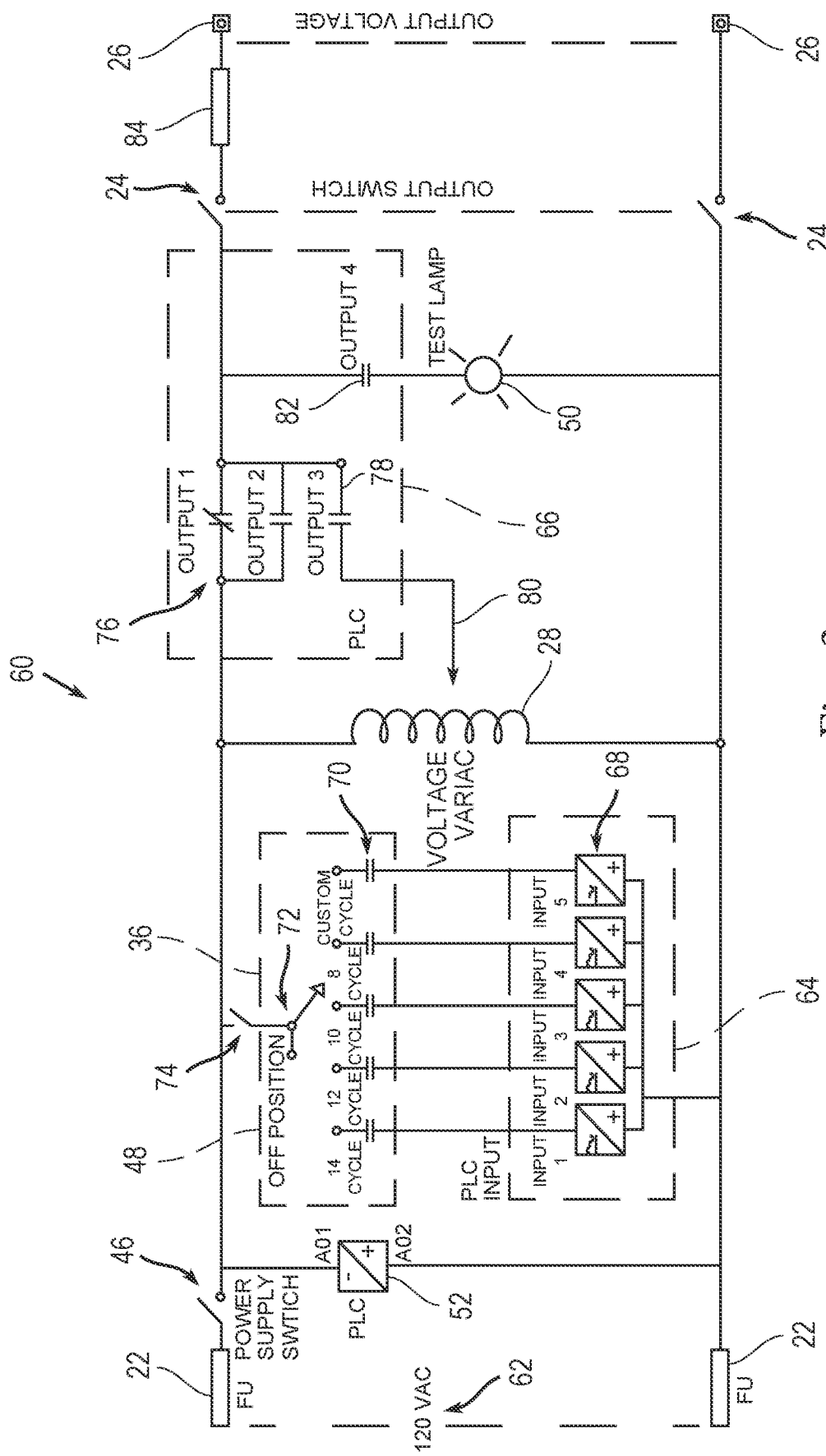
FIG. 3 is a circuit diagram of the apparatus of FIG. 1.

As shown in FIG. 1, the smart voltage dip simulator apparatus 10 is implemented in a housing 12 configured to retain various components, such as shown in FIGS. 1-3. A handle 14 can be included and attachable to the housing 12 to allow the apparatus 10 to be portable. For example, the handle 14 can be attached to the housing 12. The apparatus 10 can include a display 16. The display 16 can be a liquid crystal display (LCD). Alternatively, the display 16 can be a light emitting diode (LED) based display. For example, the LED-based display can be an organic LED (OLED) display. The display 16 is configured to display a test voltage value 18. In addition, the display 16 is configured to display an input voltage value 20. In the example shown in FIG. 1, the test voltage value 18 and the input voltage value 20 can display the value of "119", indicating that both of the test voltage value 18 and the input voltage value 20 are 119 volts. It is to be understood that the test voltage value 18 and the input voltage value 20 can be different. The display 16 can also include text such as "TEST VOLTAGE" and "INPUT VOLTAGE" positioned adjacent to the corresponding voltage value 18, 20. It is understood that the text can be in any known language, such as English.

The apparatus 10 also can include a fuse 22. For example, the fuse 22 can be an 8 Amp fuse. In addition, the apparatus 10 can include an output switch 24. In the example shown in FIG. 1, the output switch 24 can be a toggle switch. Alternatively, the output switch 24 can be a push button switch. Still further, the output switch 24 can be a dial switch. The apparatus 10 further includes at least one output jack 26 to provide a 120 VAC controlled output to the motor starter to be tested. Furthermore, the apparatus 10 includes a variable voltage controller 28. The variable voltage controller 28 can be implemented by a rotatable knob. Alternatively, the variable voltage controller 28 can be implemented by at least one toggle switch. Still further, the variable voltage controller 28 can be implemented by at least one push button switch. Indicia 30, 32, 34 can be emplaced on the housing 12 adjacent to the variable voltage controller 28 to indicate voltage values set by the variable voltage controller 28. For example, the indicia 30, 32, 34 can represent 0%, 50%, and 100%, respectively. It is understood that the indicia 30, 32, 34 can be in any known language, such as English. The variable voltage controller 28 can be attached to a voltage variac, as shown in FIG. 3. In addition, the variable voltage controller 28 can be any type of voltage autotransformer.

The apparatus 10 also includes a time selection controller 36 configured to allow a user to select a duration of the test. The time selection controller 36 can be implemented by a rotatable knob. Alternatively, the time selection controller 36 can be implemented by at least one toggle switch. Still further, the time selection controller 36 can be implemented by at least one push button switch. Indicia 38 can be emplaced on the housing 12 adjacent to the time selection controller 36 to indicate time values set by the time selection controller 36. For example, the indicia 38 can read "TIME SELECTOR", "OFF", "8 CYCLE", "10 CYCLE", "12 CYCLE", "14 CYCLE", and "CUSTOM CYCLE". It is understood that the indicia 38 can be in any known language, such as English.

The apparatus 10 can further include a connector 40 configured to connect the apparatus 10 to an external device to select a custom time when the time selection controller 36 is set to the indicia "CUSTOM CYCLE". The connector 40 can be an RS-232 serial communication cable port. The external device can be a computing device having an RS-232 serial communication cable port and operating a serial communication protocol. Other known types of connectors can be used to connect the apparatus 10 to an external device. For example, the connector 40 can be a parallel communication cable port. The connector 40 can transmit and receive data, including a custom time selection, to and from the external device using, for example, a SEL QUICKSET software application.

In addition, the apparatus 10 can include an external power input connector 42 configured to connect to an external power supply through a power cable 44. For example, the external power supply can be a 120 VAC power supply. The external power input connector 42 can include a switch 46 configured to supply or block the supply of the external power through the connector 42. The switch 46 can be a toggle switch with indicia such as "1" signifying an ON state, and "0" signifying an OFF state. Alternatively, the indicia can read "ON" and "OFF". It is understood that the indicia can be in any known language, such as English. Furthermore, the power supply of the apparatus 10 can be a battery. The battery can be internal to the housing 12. Alternatively, the battery can be external to the housing 12. The battery can be rechargeable. For example, the external power input connector 42 can be configured to connect an external power supply to the rechargeable battery to recharge the battery.

Furthermore, the apparatus 10 can include a test controller 48 configured to initiate the test by the apparatus 10. The test controller 48 can be implemented by a rotatable knob. Alternatively, the test controller 48 can be implemented by at least one toggle switch. Still further, the test controller 48 can be implemented by at least one push button switch. Indicia can be emplaced on the housing 12 adjacent to the test controller 48 such as "TEST SWITCH" to identify the test controller 48. In addition, the apparatus 10 can include a test lamp 50 which illuminates when the test is in progress after initiation by the test controller 48. The test lamp 50 can be an incandescent bulb. Alternatively, the test lamp 50 can be an LED. Still further, the test lamp 50 can be an OLED. Moreover, the test lamp 50 can be an LCD. The test lamp 50 can emit light of a predetermined color, such as red, to indicate that the test is in progress. Indicia can be emplaced on the housing 12 adjacent to the test lamp 50 such as "TEST LAMP" to identify the test lamp 50. It is understood that any indicia on the housing 12 can be in any known language, such as English.

As shown in FIG. 2, the apparatus 10 includes a programmable logic controller (PLC) 52, a power supply 54, and an output jack 56 configured to be connected to a motor starter 58. The power supply 54 can be a battery. Alternatively, the power supply 54 can be the external power input connector 42 shown in FIG. 1. In addition, the output jack 56 can be connected to the output jack 26 shown in FIG. 1.

Referring to FIG. 3, a circuit diagram of an internal circuit 60 illustrates the test apparatus 10 of FIGS. 1-2 in greater detail. As shown in FIG. 3, the power supply 62 of, for example, 100 VAC to 120 VAC is applied to the circuit 60 through the power cable 44, through the fuse 22, and through the power supply switch 46, when the power supply switch 46 is closed. The PLC 52 is connected to the power supply switch 46, and the PLC 52 includes a PLC input section 64 and a PLC output section 66. The PLC input section 64 can include a plurality of inputs 68, with each input connected to a respective setting of a plurality of settings 70 of the time selection controller 36. For example, the time selection controller 36 can be implemented as a rotary switch 72 having the plurality of settings 70, including settings for the "OFF" position, as well as for the custom cycle, the 8 cycle, the 10 cycle, the 12 cycle, and the 14 cycle. The cycles can be measured in terms of a power frequency of 60 Hz, or 60 cycles per second. Accordingly, the setting of an 8 cycle equals a test duration of 133.333 msec. or 0.133 seconds, a 10 cycle equals a test duration of 166.666 msec. or 0.166 seconds, a 12 cycle equals a test duration of 200 msec. or 0.200 seconds, and a 14 cycle equals a test duration of 233.333 msec. or 0.233 seconds.

The rotary switch 72 of the time selection controller 36 is connected to a switch 74 to the power supply switch 46. Similarly, a voltage variac 28 and the PLC output section 66 are connected to the power supply switch 46. The PLC output section 66 includes a plurality of outputs 76, with one output 78 connected to an input 80 of the voltage variac 28. In addition, an output 82 of the PLC output section 66 is connected to the test lamp 50. Another fuse 84 can be included between the output switch 24 and the output jack 26.

Figure 4:
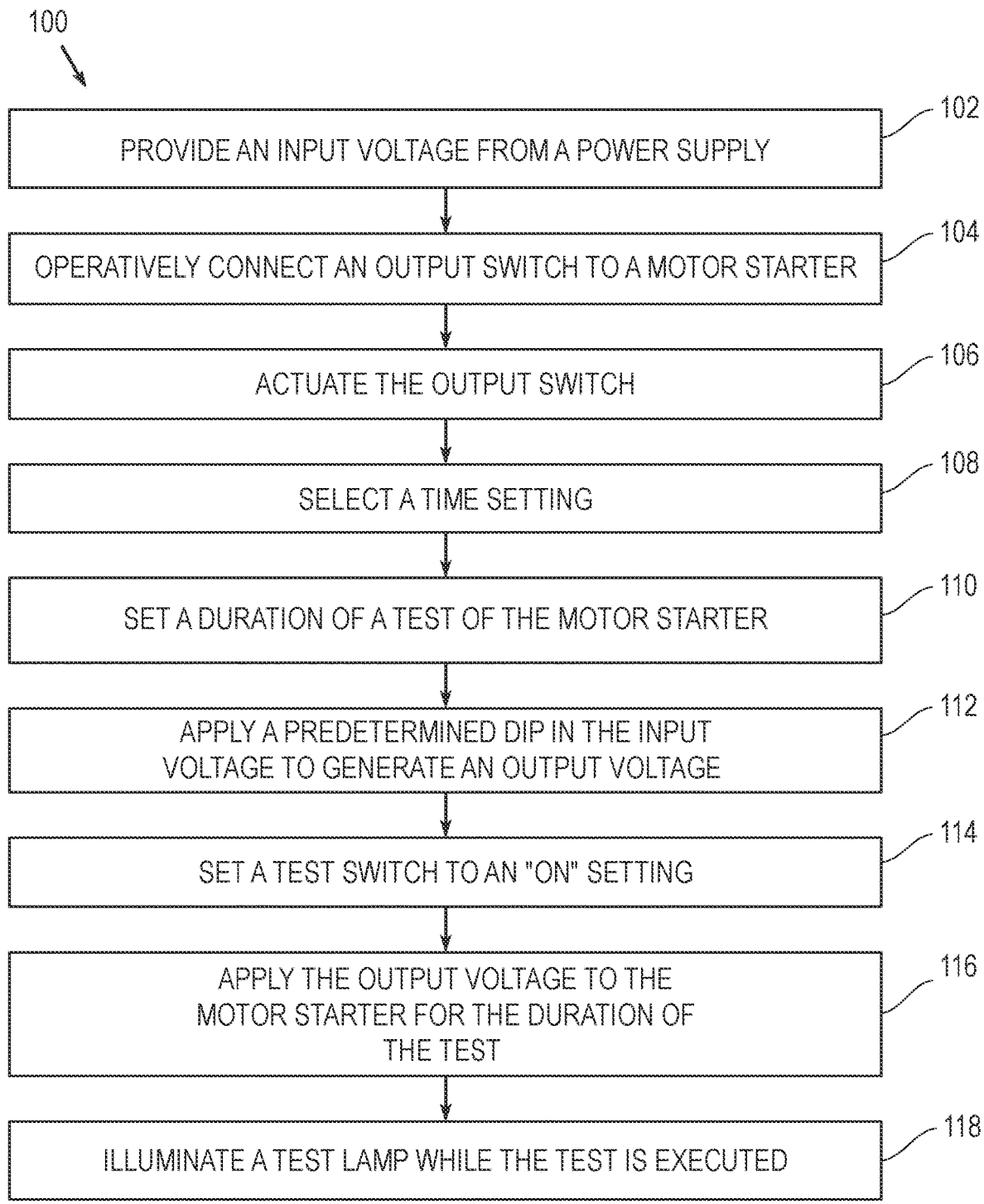
FIG. 4 is a flowchart of a method of operation of the apparatus of FIG. 1, according to the embodiment.

As shown in FIG. 4, a method 100 of operation of the apparatus 10 includes the step of providing an input voltage from the power supply 62 in step 102. The method 100 then operatively connects the output switch 24 to the motor starter 58 in step 104. Actuation of the output switch 24 is performed in step 106, and a time setting is selected in step 108 using the time selection controller 36. In response to the time setting, the method 100 sets a duration of a test of the motor starter 58 in step 110. The method 100 then applies a predetermined dip in the input voltage to generate an output voltage in step 112. The method 100 then sets the test switch 48 to an "ON" setting in step 114, and the output voltage is applied to the motor starter 58 in step 116 for the duration of the test. The method 100 then illuminates the test lamp 50 in step 118 while the test is executed.

In this manner, as the test is executed on the motor starter 58, the predetermined dip in the input voltage is applied to the motor starter 58 for the duration of the test. The predetermined dip simulates a voltage dip during typical operation of the motor starter 58. Accordingly, the ride through circuit of the motor starter 58 responds to the predetermined dip so that the ride through circuit is tested using the apparatus 10 instead of during typical operation of the motor starter 58. Thus, the reliability of the motor starter 58 and its ride through circuit can be evaluated apart from the typical operation of the motor starter 58.

Portions of the methods described herein can be performed by software or firmware in machine readable form on a tangible (e.g., non-transitory) storage medium. For example, the software or firmware can be in the form of a computer program including computer program code adapted to cause the system to perform various actions described herein when the program is run on a computer or suitable hardware device, and where the computer program can be embodied on a computer readable medium. Examples of tangible storage media include computer storage devices having computer-readable media such as disks, thumb drives, flash memory, and the like, and do not include propagated signals. Propagated signals can be present in a tangible storage media. The software can be suitable for execution on a parallel processor or a serial processor such that various actions described herein can be carried out in any suitable order, or simultaneously.

It is to be further understood that like or similar numerals in the drawings represent like or similar elements through the several figures, and that not all components or steps described and illustrated with reference to the figures are required for all embodiments or arrangements.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "contains", "containing", "includes", "including," "comprises", and/or "comprising," and variations thereof, when used in this specification, specify the presence of stated features, integers, steps, operations, elements, and/or components, but do not preclude the presence or addition of one or more other features, integers, steps, operations, elements, components, and/or groups thereof.

Terms of orientation are used herein merely for purposes of convention and referencing and are not to be construed as limiting. However, it is recognized these terms could be used with reference to an operator or user. Accordingly, no limitations are implied or to be inferred. In addition, the use of ordinal numbers (e.g., first, second, third) is for distinction and not counting. For example, the use of "third" does not imply there is a corresponding "first" or "second." Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

While the disclosure has described several exemplary embodiments, it will be understood by those skilled in the art that various changes can be made, and equivalents can be substituted for elements thereof, without departing from the spirit and scope of the invention. In addition, many modifications will be appreciated by those skilled in the art to adapt a particular instrument, situation, or material to embodiments of the disclosure without departing from the essential scope thereof. Therefore, it is intended that the invention not be limited to the particular embodiments disclosed, or to the best mode contemplated for carrying out this invention, but that the invention will include all embodiments falling within the scope of the appended claims.

The subject matter described above is provided by way of illustration only and should not be construed as limiting. Various modifications and changes can be made to the subject matter described herein without following the example embodiments and applications illustrated and described, and without departing from the true spirit and scope of the invention encompassed by the present disclosure, which is defined by the set of recitations in the following claims and by structures and functions or steps which are equivalent to these recitations.

What is claimed is:

1. A test apparatus configured to test a motor starter, comprising:
    a power supply configured to receive an applied input voltage and to provide an output voltage;
    an output switch configured to operatively connect the power supply to the motor starter and to apply the output voltage to the motor starter when the output switch is actuated;
    a test switch having an OFF setting and an ON setting, wherein a test of the motor starter is executed when the test switch is in the ON setting;
    a test lamp configured to illuminate while the test is executed;
    a time selector including a knob or switch configured to set a user-selected time setting from among a plurality of time settings, wherein a duration of the test is controlled by the user-selected time setting from among the plurality of time settings; and
    a programmable logic controller (PLC) connected to the knob or switch of the time selector, and including code therein configured to receive the user-selected time setting from the knob or switch, and to apply a predetermined dip to reduce the applied input voltage to the power supply and having code therein configured to generate the output voltage applied to the motor starter for the selected duration of the test.

2. The test apparatus of claim 1, further comprising:
    a voltage dip selector including a plurality of dip settings, wherein the predetermined dip is controlled by a selected dip setting from among the plurality of dip settings.

3. The test apparatus of claim 1, further comprising:
    an output voltage jack configured to electrically couple the power supply to the motor starter through the output switch.

4. The test apparatus of claim 1, further comprising:
    a display configured to continuously display the applied input voltage and the provided output voltage.

5. The test apparatus of claim 1, further comprising:
    a power jack configured to connect the power supply to the output switch,
    wherein the power supply is an external power supply.

6. The test apparatus of claim 1, wherein the power supply is a battery.

7. The test apparatus of claim 1, further comprising:
    a portable housing configured to retain therein the power supply, the output switch, the test switch, the test lamp, the time selector, and the PLC.

8. A portable test apparatus configured to test a motor starter, comprising:
    a power supply configured to receive an input voltage and to provide an output voltage;
    an output switch configured to operatively connect the power supply to the motor starter and to apply the output voltage to the motor starter when the output switch is actuated;
    a test switch having an OFF setting and an ON setting, wherein a test of the motor starter is executed when the test switch is in the ON setting;
    a test lamp configured to illuminate while the test is executed;
    a time selector including a plurality of time settings, wherein a duration of the test is controlled by a selected time setting from among the plurality of time settings;
    a programmable logic controller (PLC) including code therein configured to apply a predetermined dip to reduce the applied input voltage to the power supply and having code therein configured to generate the output voltage applied to the motor starter for the selected duration of the test; and
    a portable housing configured to retain therein the power supply, the output switch, the test switch, the test lamp, the time selector, and the PLC.

9. The portable test apparatus of claim 8, further comprising:
    a voltage dip selector including a plurality of dip settings, wherein the predetermined dip is controlled by a selected dip setting from among the plurality of dip settings.

10. The portable test apparatus of claim 8, wherein the time selector includes a knob or switch configured to set the user-selected time setting from among the plurality of time settings, and
    wherein the PLC is connected to the knob or switch of the time selector and configured to receive the user-selected time setting from the knob or switch.

11. The portable test apparatus of claim 8, further comprising:
    a display configured to continuously display the applied input voltage and the provided output voltage.

12. The portable test apparatus of claim 8, further comprising:
    a power jack configured to connect the power supply to the output switch,
    wherein the power supply is an external power supply.

13. The portable test apparatus of claim 8, wherein the power supply is a battery.

14. The portable test apparatus of claim 8, further comprising:
    a handle coupled to the housing.

15. A method configured to test a motor starter, comprising:
    providing a time selector including a knob or switch configured to set a user-selected time setting from among a plurality of time settings;
    receiving an input voltage from a power supply;
    providing an output voltage from the power supply;
    operatively connecting an output switch to the motor starter;
    actuating the output switch to electrically couple the power supply to the motor starter;
    selecting the user-selected time setting from among the plurality of time settings using the knob or switch of the time selector;
    receiving the user-selected time setting from the knob or switch at a programmable logic controller (PLC) including code therein configured to generate the output voltage; and
    setting a duration of the test from the user-selected time setting;
    applying a predetermined dip to reduce the applied input voltage to the power supply using the PLC connected to the knob or switch of the time selector;
    setting a test switch to an ON setting;
    applying the output voltage to the motor starter for the selected duration of the test to execute a test of the motor starter; and
    illuminating a test lamp while the test is executed.

16. The method of claim 15, further comprising:
    controlling the predetermined dip using a dip setting selected from among the plurality of dip settings using a voltage dip selector.

17. The method of claim 15, further comprising:
electrically coupling the power supply to the motor starter through the output switch using an output voltage jack.

18. The method of claim 15, further comprising:
continuously displaying the applied input voltage and the provided output voltage using a display.

19. The method of claim 15, further comprising:
connecting the power supply to the output switch using a power jack,
wherein the power supply is an external power supply.

20. The method of claim 15, wherein the power supply is a battery.

* * * * *